(12) United States Patent  
Su et al.

(10) Patent No.: US 8,164,161 B2  
(45) Date of Patent: Apr. 24, 2012

(54) STRUCTURE OF TRENCH CAPACITOR AND METHOD FOR MANUFACTURING THE SAME

(75) Inventors: Yi-Nan Su, Tao-Yuan (TW); Chun-Ming Chang, Kaohsiung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 138 days.

(21) Appl. No.: 12/197,294

(22) Filed: Aug. 24, 2008

(65) Prior Publication Data

US 2010/0044832 A1 Feb. 25, 2010

(51) Int. Cl.
*H01L 21/02* (2006.01)
(52) U.S. Cl. ............... 257/532; 257/300; 257/E21.008
(58) Field of Classification Search .................. 257/300, 257/301, 302, 303, 532, E21.008, E29.342
See application file for complete search history.

(56) References Cited

U.S. PATENT DOCUMENTS

| | | | |
|---|---|---|---|
| 6,200,873 B1* | 3/2001 | Schrems et al. | 438/386 |
| 6,297,088 B1* | 10/2001 | King | 438/243 |
| 6,797,579 B2* | 9/2004 | Yoo et al. | 438/311 |
| 7,087,948 B2 | 8/2006 | Hsu | |
| 2003/0132438 A1 | 7/2003 | Jang | |
| 2005/0145914 A1* | 7/2005 | Tanaka et al. | 257/301 |
| 2008/0213967 A1* | 9/2008 | Su et al. | 438/386 |

* cited by examiner

*Primary Examiner* — Chuong A Luu  
*Assistant Examiner* — Nga Doan  
(74) *Attorney, Agent, or Firm* — Winston Hsu; Scott Margo

(57) ABSTRACT

A structure of trench capacitor and method for manufacturing the trench capacitor is provided. The collar oxide layer of the trench capacitor is formed by a thermal oxidation process. Moreover, a protective layer such as silicon nitride covers the collar oxide layer. A failure analysis of the collar oxide layer can be operated by detecting the protective layer. If the protective layer is detected, the collar oxide layer is therefore at a suitable thickness. Furthermore, a mask layer rather than the collar oxide layer is used as a mask during the trench formation.

12 Claims, 6 Drawing Sheets

STRUCTURE OF TRENCH CAPACITOR AND METHOD FOR MANUFACTURING THE SAME

BACKGROUND OF THE INVENTION

1. Field of the Invention

The invention relates to a structure of a trench capacitor and method for manufacturing the same, and more particularly, to a method of manufacturing a trench capacitor with a protective layer covering on the collar oxide layer. In this way, the reliability of a failure analysis can be improved.

2. Description of the Prior Art

As electrical products tend towards increasing miniaturization, DRAM devices need to have a high integration and density. Trench capacitor DRAM devices are popularly used as high density DRAMs formed in a deep trench capacitor of the semiconductor substrate to effectively decrease the size of the memory unit and efficiently utilize the space of the chip.

Please refer to FIG. 1 to FIG. 5, which are schematic cross-sectional views showing the fabrication of the trench capacitor according to the prior art.

As shown in FIG. 1, a substrate 10 having a STI 12, a pad silicon nitride 14, a buffering silicon nitride 16 and a plasma enhanced oxide (PEOX) layer 18 is provided. An etching process is performed to form a trench 20. As shown in FIG. 2, an oxide layer 22 is deposited on the surface of the trench 20 and the PEOX layer 18. As shown in FIG. 3, a trench 24 is formed by taking the oxide layer 22 as a mask and the trench 24 extends from the bottom of the trench 20 into the substrate 10. The remaining oxide layer 22 serves as a collar oxide layer 32. As shown in FIG. 4, a bottom electrode 26 is formed on the sidewall of the trench 20, 24. As shown in FIG. 5, a capacitor dielectric layer 28 is formed to cover the bottom electrode 26. Then, a conductive material 30 serving as a top electrode fills up the trench 20, 24. Finally, the pad silicon nitride 14, the buffering silicon nitride 16 and the PEOX layer 18 are removed.

According to the conventional method, the collar oxide layer 32 is made by the following steps: first, dry etching the oxide layer 22 to form a spacer-like structure on the sidewall of the trench 20; and etching the substrate 10 by taking the spacer-like structure as a mask. The trench 24 is formed in this way. In the above steps, most of the oxide layer 22 is removed, and the remaining oxide layer 22 is taken as the collar oxide layer 32. In other words, part of the oxide layer 22 serves as a mask during the trench 24 formation, and part of the oxide layer 22 serves as the collar oxide layer 32. Therefore, to assure the collar oxide layer 32 has a sufficient thickness, a thicker thickness of the oxide layer 22 is formed before the etching process in the conventional process. If the etching time is not well-controlled, for example, a slight increase in the etching time will lead to over-etching of the oxide layer 22 and the collar oxide layer 32 will be too thin to provide a good insulating function. Therefore, the trench capacitor will have a current leakage problem. On the other hand, if the etching time is not long enough, the collar oxide layer 32 will be too thick and the capacitance of the trench capacitor will decrease. Furthermore, the quality of the deposited electrode will also be deteriorated.

Moreover, during a failure analysis process, the conventional detecting machine has a problem in determining the thickness of the collar oxide layer 32, which leads to an inaccurate failure analysis.

Therefore, it is important to provide a fabricating method to form a collar oxide with a suitable thickness, and to improve accuracy of the failure analysis process.

SUMMARY OF THE INVENTION

It is therefore a primary objective of the claimed invention to provide a trench capacitor and a method to solve the over-etching or insufficient etching problem of the collar oxide layer, and to improve the accuracy of the failure analysis.

According to the present invention, a method of fabricating a trench capacitor is provided. Initially, a substrate having an STI is provided. The substrate and the STI are then etched partly to form a first trench in the substrate and the STI. An oxidation process is thereafter performed to form an oxide layer in the substrate positioned at the sidewall of the first trench. Next, a protective layer is formed to cover the oxide layer. Subsequently, a mask layer is formed on the sidewall of the first trench and the mask layer covers the protective layer. After that, the mask layer is etched back and the substrate is etched from the bottom of the first trench to form a second trench. Afterwards, a first electrode is formed on the sidewall of the second trench. Next, a capacitor dielectric layer is formed on the surface of the first electrode. Finally, a second electrode is formed in the first trench and second trench.

Another objective of the present invention is to provide a trench capacitor. The trench capacitor includes a substrate having an STI, a first trench and a second trench, a first electrode filling up the first trench and the second trench, an oxide layer positioned in the substrate at the sidewall of the first trench, a protective layer covering the oxide layer, a second electrode positioned at the sidewall of the second trench and a capacitor dielectric layer positioned between the second electrode and the first electrode. The second trench is positioned below the first trench and connects to the first trench, and the first trench is next to the STI.

According to a preferred embodiment of the present invention, a mask layer can be optionally positioned on the protective layer. The mask layer can be silicon oxide, silicon nitride, tetra-ethyl-ortho-silicate (TEOS) or silicon-oxy-nitride. According to another embodiment of the present invention, the protective layer can be silicon nitride or silicon-oxy-nitride. The thickness of the protective layer is preferably 50~150 angstroms. According to another embodiment of the present invention, the thickness of the oxide layer is preferably 30~200 angstroms.

Unlike the conventional method, the collar oxide layer in the present invention is formed by the thermal oxidation process. Moreover, a protective layer and a mask layer cover the collar oxide layer. During the second trench formation, the mask layer serves as a mask. Therefore, the over-etching or insufficient etching problem of the collar oxide layer can be avoided. Furthermore, the protective layer can be utilized as an indicating material to determine if the collar oxide layer is at a suitable thickness.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
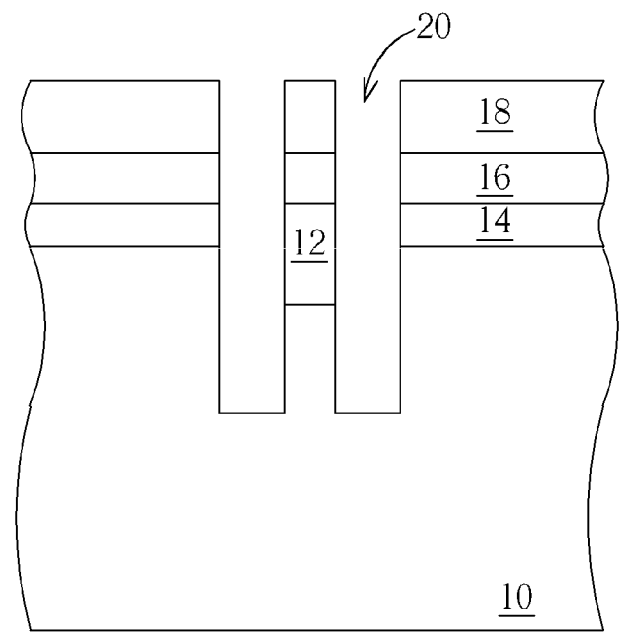
FIG. 1 to FIG. 5 are schematic cross-sectional views showing the fabrication of the trench capacitor according to a prior art.
Figure 2:
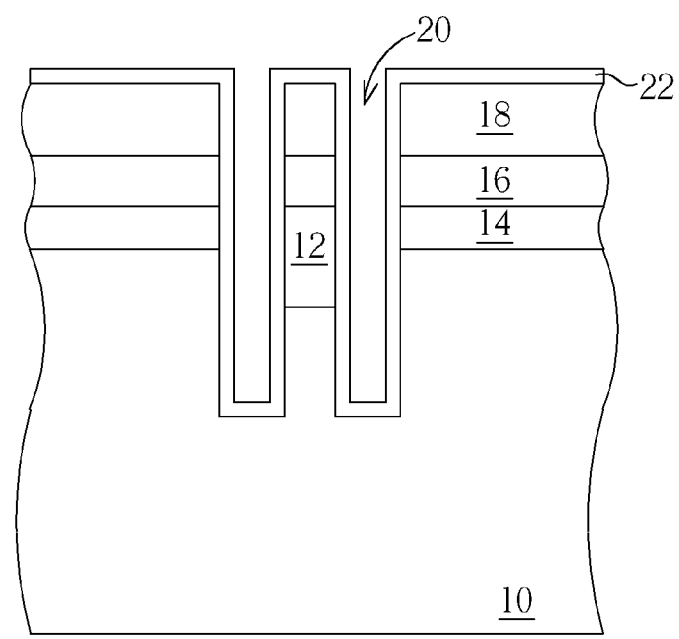
Figure 3:
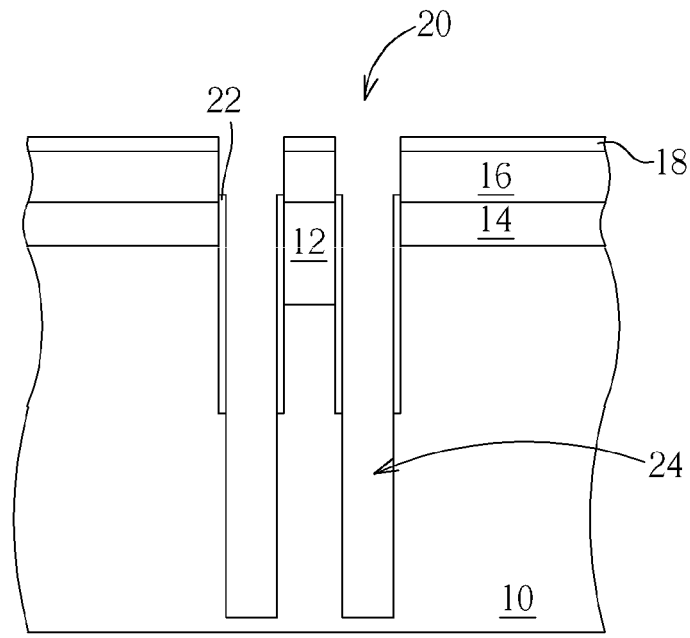
Figure 4:
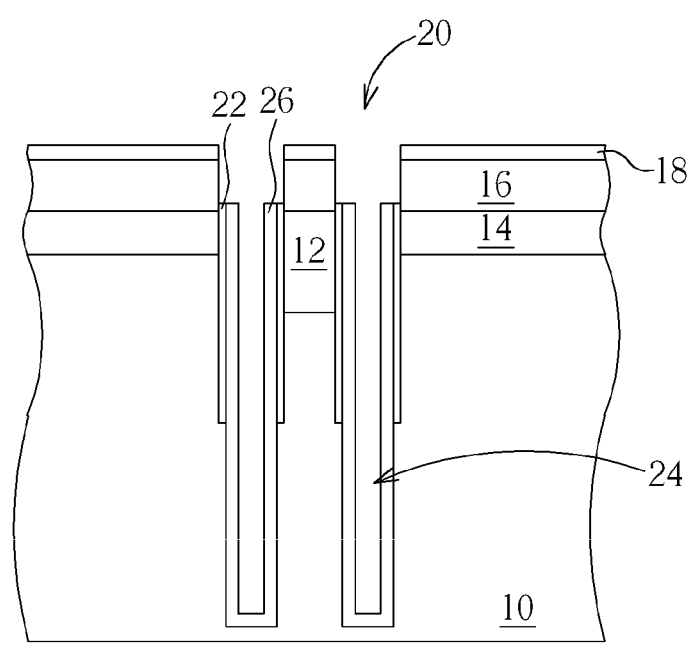
Figure 5:
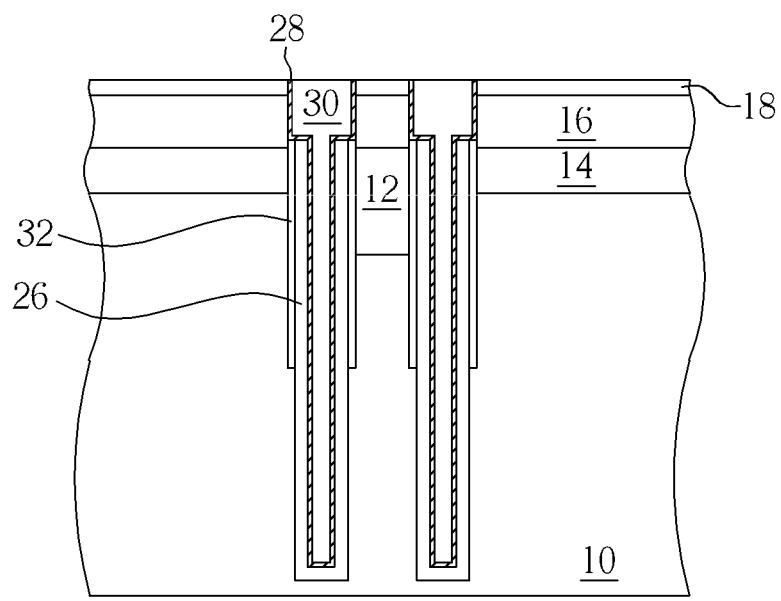
Figure 6:
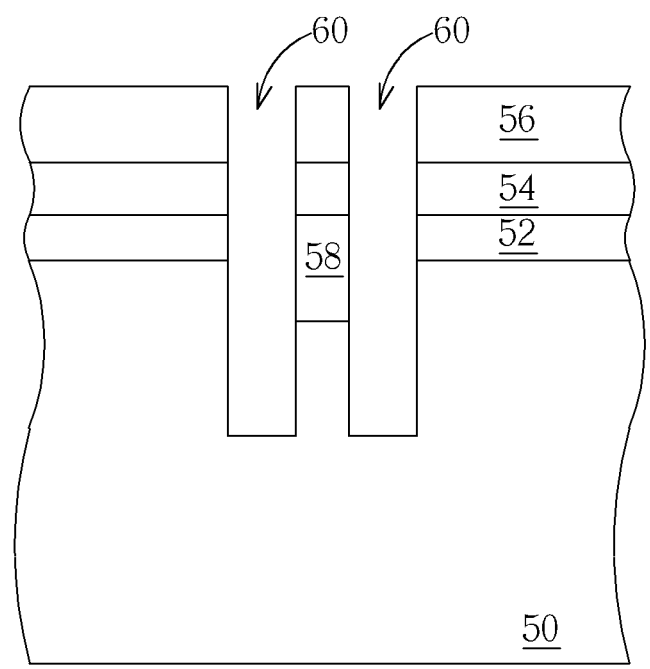
FIG. 6 to FIG. 11 are schematic diagrams illustrating a fabricating method of a trench capacitor of the present invention.

FIG. 6 to FIG. 11 are schematic diagrams illustrating a fabricating method of a trench capacitor of the present invention. As shown in FIG. 6, a substrate such as a semi-conductive substrate 50 is provided. The semi-conductive substrate 50 is covered by a pad silicon nitride 52, a buffering silicon nitride layer 54 and a plasma enhanced oxide (PEOX) layer 56. In addition, the semi-conductive substrate 50 has an STI 58. The STI 58 is formed in the semi-conductive substrate 50, the pad silicon nitride 52 and the buffering silicon nitride layer 54 by the conventional STI formation process. Then, a patterned photoresist (not shown) is taken as a mask to partly etch the PEOX layer 56, the buffering silicon nitride layer 54, the STI, the pad silicon nitride 52 and the semi-conductive substrate 50. In this way, a first trench 60 is formed at two sides of the STI 58.

Figure 7:
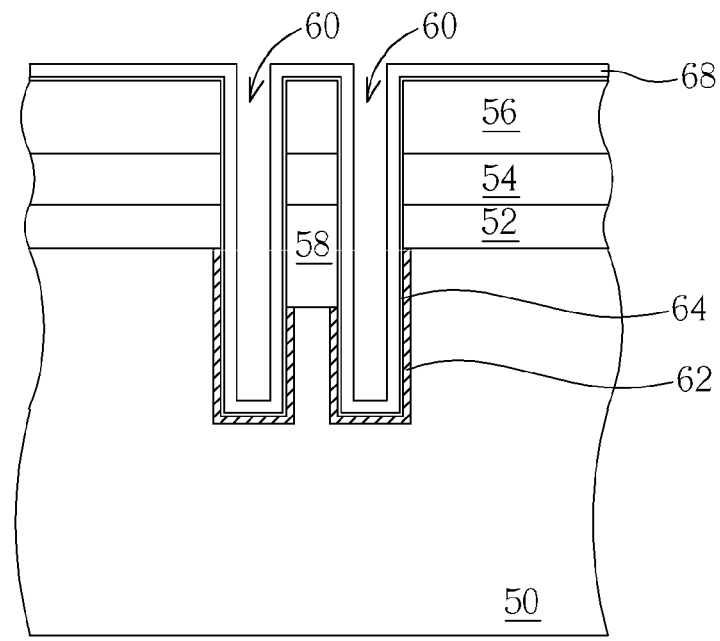

As shown in FIG. 7, a thermal process such as a rapid thermal oxidation process or an in-situ steam generation process is performed to form an oxide layer 62 in the semi-conductive substrate 50 at the sidewall of the first trench 60. The oxide layer 62 will serve as a collar oxide layer after the trench capacitor formation is completed. The thickness of the oxide layer 62 depends on product requirements. According to a preferred embodiment of the present invention, the thickness of the oxide layer 62 is 30~200 angstrom.

After that, a protective layer 64 is deposited on the surface of the first trench 60 and covers the PEOX layer 56 and the oxide layer 62. The protective layer 64 can be silicon nitride or silicon-oxy-nitride or any material different from silicon oxide. According to a preferred embodiment of the present invention, the thickness of the protective layer 64 is 50~150 angstroms. Next, a mask layer 68 is deposited to cover the protective layer 64. The mask layer 68 can be silicon oxide, silicon nitride, TEOS and silicon-oxy-nitride. The thickness of the mask layer 68 is preferably 200~500 angstroms.

Figure 8:
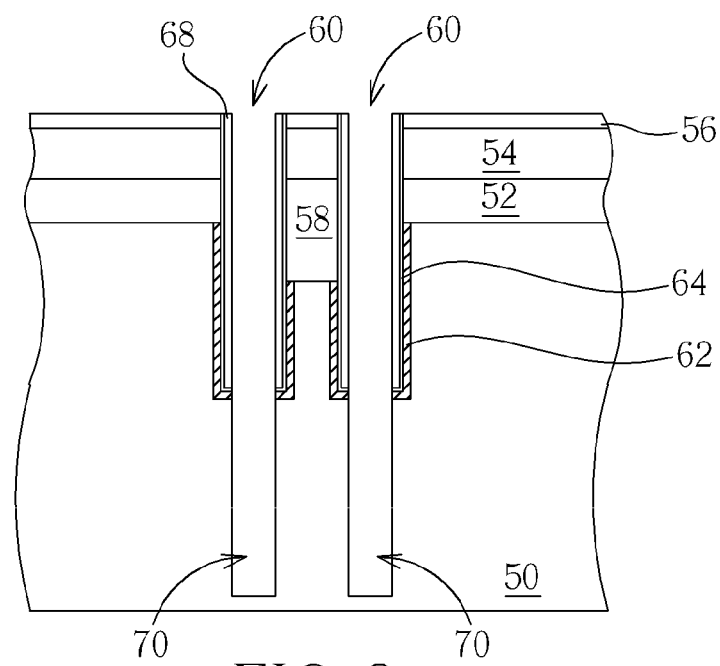

As shown in FIG. 8, the mask layer 68 is etched to form a spacer-like structure at the sidewall of the first trench 60. Then, the spacer-like structure is taken as a mask to continue the etching process from the bottom of the first trench 60 to the protective layer 64, the oxide layer 62 and the semi-conductive substrate 50 so as to form a second trench 70. That is, the second trench 70 is extended from the bottom of the first trench 60 into the semi-conductive substrate 50. Therefore, after the second trench 70 is formed, most of the mask layer 68 is removed. The oxide layer 62 on the sidewall of the first trench 60 is protected by both the protective layer 64 and the mask layer 68. Therefore, the oxide layer 62 can maintain a suitable thickness (such as 30~200 angstroms) for serving as an effective collar oxide layer.

Figure 9:
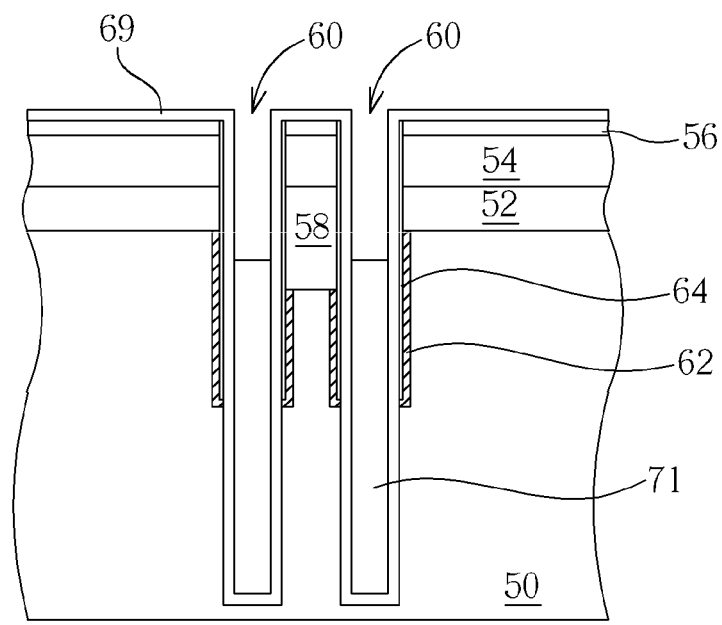

As shown in FIG. 9, the mask layer 68 is removed. Then the surface of the second trench 70 and the surface of the protective layer 64 are rinsed by the diluted hydrofluoric acid (HF). The mask layer 68 can be removed optionally according to different product requirements.

Next, a conductive material 69 such as polysilicon is deposited on the surface of the first trench 60, the second trench 70 and the PEOX layer 56 conformally. After that, a photoresist layer 71 is formed to cover the conductive material 69 entirely. Then, the photoresist layer 71 is partly removed by the etching process, and the remaining photoresist layer 71 fills up the second trench 70 and part of the first trench 60. Next, another etching process is performed to remove the conductive material 69 which is uncovered by the photoresist layer 71. Therefore, only the conductive material 69 which is on part of the sidewall of the first trench 60 and on the sidewall of the second trench 70 remains. The remaining conductive material 69 serves as the bottom electrode 72 of the trench capacitor. Next, the whole of the photoresist layer 71 is removed.

Figure 10:
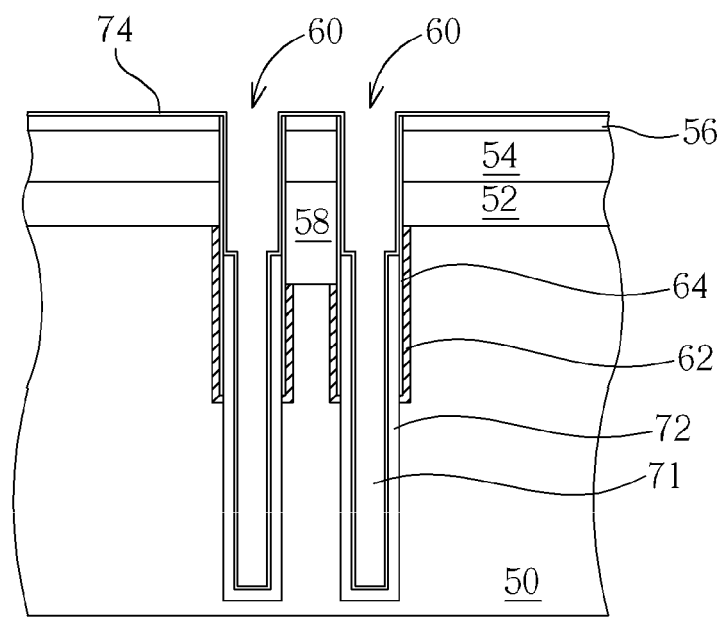

As shown in FIG. 10, a capacitor dielectric layer 74 is formed on the surface of the protective layer 64, the surface of the bottom electrode 72 and the surface of the PEOX layer 56. The capacitor dielectric layer 74 can be silicon oxide, silicon nitride, silicon nitride/silicon oxide, silicon oxide/silicon nitride/silicon oxide or silicon-oxy-nitride.

Figure 11:
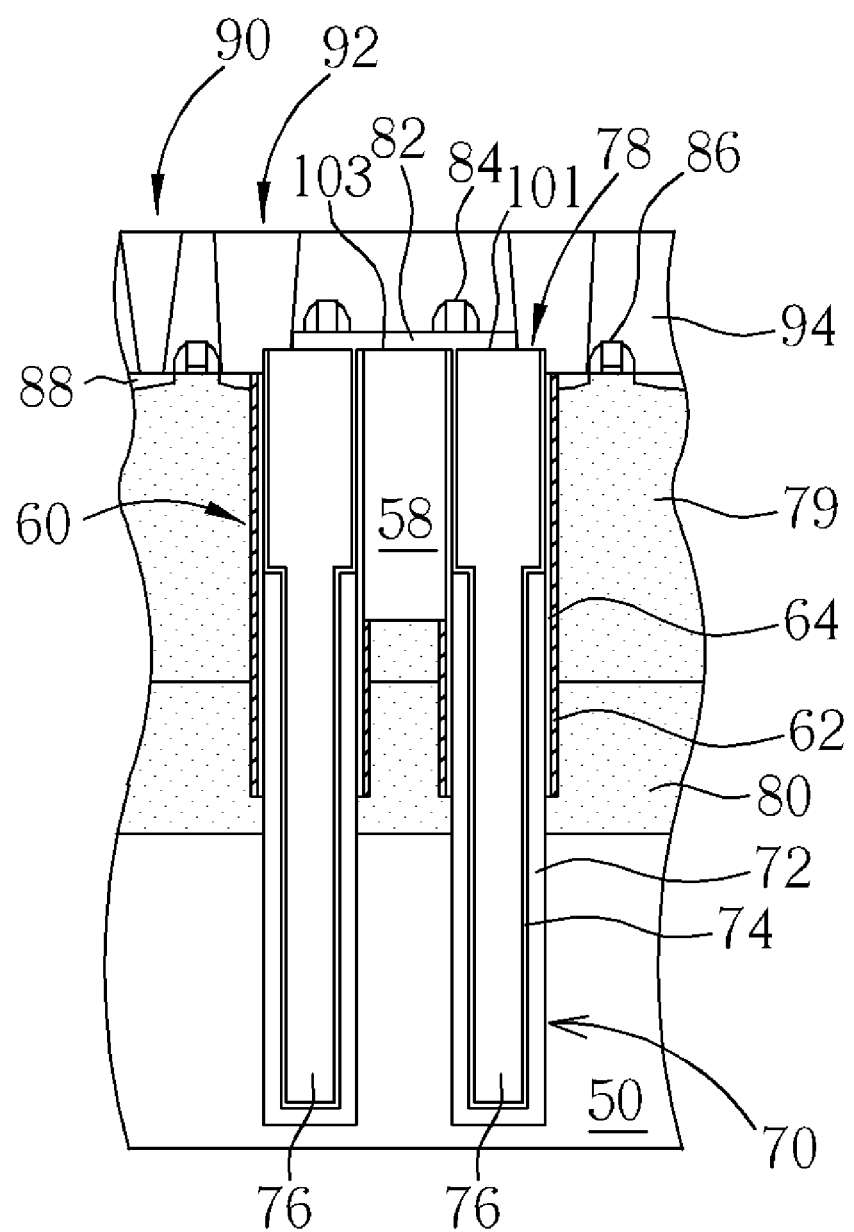

As shown in FIG. 11, a conductive material such as polysilicon fills up the first trench 60 and the second trench 70. The conductive material serves as a top electrode 76 of the trench capacitor 78. Then, a planarization process is performed to planarize the conductive material, the capacitor dielectric layer 74, the buffering silicon nitride layer 54 and part of the pad silicon nitride 52. At this point, the trench capacitor 78 is finished. It is noteworthy that a top surface 101 of the top electrode 76 is aligned with a top surface 103 of the STI 58.

Subsequently, peripheral elements are formed to complete a DRAM cell. For example, a conductive band 80 is formed by the ion implantation process. The conductive band 80 is for the trench capacitor 78 to be grounded. Then, an array well 89 is formed below the conductive band 80. An insulating structure 82 will then cover the STI 58 and the trench capacitor 78. After that, a passing gate 84 and a gate 86 for controlling the corresponding trench capacitor are formed on the insulating structure 82 and the semi-conductive substrate 50. Then, a source/drain doping region 88 is formed at two sides of the gate 86. Afterwards, a bit line contact 90 and a surface contact 92 are formed on the source/drain doping region 88. Finally, an interlayer dielectric layer 94 is formed between the bit line contact 90 and the surface contact 92, and on the gate 86 and the passing gate 84. The method of making peripheral elements is well known for those well versed in the art, and is therefore omitted here.

The trench capacitor 78 of the present invention has the features of the oxide layer 62 serving as the collar oxide layer being formed by the thermal oxidation process or ISSG process rather than the deposition process of the conventional method. Therefore, the oxide layer 62 has a better quality. In addition, the major function of the protective layer 64 is for the detecting machine to determine if the collar oxide has an effective thickness to provide an isolating function. The protective layer 64 covers the collar oxide layer, and therefore, if the protective layer 64 is detected by the detecting machine, the effectiveness of the collar oxide layer can be assured. Furthermore, the collar oxide layer and the protective layer 64 are made of different materials, and therefore, the detecting machine can easily distinguish one from another. Accordingly, the conventional method which detects the thickness of the collar oxide layer by the detecting machine can be replaced by the method provided in the present invention. Moreover, the mask layer 68 of the present invention serves as the mask when making the second trench. In this way, the conventional problem of taking the collar oxide layer as the mask which leads to over-etching or insufficient etching of the collar mask can be avoided.

Another objective of the present invention is to provide a trench capacitor. As shown in FIG. 11, a trench capacitor 78 includes a semi-conductive substrate 50, wherein the semi-conductive substrate 50 includes an STI 58, and a first trench 60 and a second trench 70. The second trench 70 is positioned below the first trench 60 and connects to the bottom of the first trench 60. The first trench 60 is next to the STI 58. The trench capacitor 78 further includes a top electrode 76 filling up the first trench 60 and the second trench 70, an oxide layer 62 serving as a collar oxide layer, a protective layer 64 covering the oxide layer 62, a bottom electrode 72 positioned on the surface of the semi-conductive substrate 50 at the sidewall and the bottom of the first trench 60 and a capacitor dielectric layer 74 positioned between the top electrode 76 and the bottom electrode 72. The oxide layer 62 is positioned in the semi-conductive substrate 50 at the sidewall of the first trench 60. The bottom electrode 72 extends from the sidewall of the second trench 70 to the sidewall of the first trench 60. Furthermore, a mask layer 68 can optionally cover the protective layer 64. The mask layer 68 can be silicon oxide, silicon nitride, TEOS or silicon-oxy-nitride. The protective layer 64 can be silicon nitride or silicon-oxy-nitride. The top electrode 76 and the bottom electrode 72 can be polysilicon or other conductive materials. According to a preferred embodiment of the present invention, the thickness of the oxide layer 62 is 30~200 angstroms. The thickness of the protective layer 64 is 50~150 angstroms. The description illustrating above is the structure of the trench capacitor 78.

Moreover, there are peripheral elements formed adjacent to the trench capacitor 78. The peripheral elements include a gate 86 and a source/drain doping region 88 next to the trench capacitor 78. The gate 86, the source/drain doping region 88 and the trench capacitor 78 constitute a DRAM cell. A bit line contact 90 and a surface contact 92 for sending signals are positioned on the source/drain doping region 88. Furthermore, an isolating structure 82 covers the STI and the trench capacitor 78. A passing gate 84 is positioned on the isolating structure 82. In addition, a conductive band 86 is located in the semi-conductive substrate 50 and the conductive band 86 is for grounding trench capacitor 78. An array well 79 is located in the semi-conductive substrate 50. An interlayer dielectric layer 94 is positioned between the gate 86 the passing gate 84, the bit line contact 90 and the surface contact 92.

The feature of the trench capacitor 78 of the present invention is as follows: first, the oxide layer 62 is covered by the protective layer 64, and therefore, the detecting machine can determine if the oxide layer 62 has the effective thickness by detecting the protective layer 64. If the protective layer 64 can be detected, the oxide layer 62 will be determined to have an effective thickness. Second, the protective layer 64 and the mask layer 64 are formed by the dielectric materials. Therefore, the protective layer 64, the mask layer 64 and the collar oxide layer can work together to be a better isolator to prevent current leakage of the trench capacitor 78.

Those skilled in the art will readily observe that numerous modifications and alterations of the device and method may be made while retaining the teachings of the invention.

What is claimed is:

1. A trench capacitor, comprising:
   a semi-conductive substrate having an STI, a first trench and a second trench, wherein the second trench is positioned below the first trench and connects to the first trench, and wherein the first trench is next to the STI;
   a first electrode filling the first trench and the second trench, wherein a top surface of the STI is aligned with a top surface of the first electrode;
   an oxide layer positioned in the semi-conductive substrate at the sidewall of the first trench, and the oxide layer contacting the semi-conductive substrate;
   a protective layer covering the sidewall of the oxide layer;
   a second electrode positioned at the sidewall of the second trench; and
   a capacitor dielectric layer positioned between the second electrode and the first electrode.

2. The capacitor of claim 1, wherein the protective layer is selected from the group consisting of silicon nitride and silicon-oxy-nitride.

3. The capacitor of claim 1, further comprising a mask layer is positioned on the protective layer, wherein the mask layer is selected from the group consisting of silicon oxide, silicon nitride, tetra-ethyl-ortho-silicate (TEOS) and silicon-oxy-nitride.

4. The capacitor of claim 1, wherein the capacitor dielectric layer is selected from the group consisting of silicon oxide, silicon nitride, silicon nitride/silicon oxide, silicon oxide/silicon nitride/ silicon oxide and silicon-oxy-nitride.

5. The capacitor of claim 1, wherein the second electrode extends from the sidewall of the second trench to the sidewall of the first trench.

6. The capacitor of claim 1, wherein the thickness of the oxide layer is 30~200 angstroms.

7. The capacitor of claim 1, wherein the thickness of the protective layer is 50~150 angstroms.

8. The capacitor of claim 1, wherein a conductive band is positioned in the semi-conductive substrate and next to the trench capacitor.

9. The capacitor of claim 1, wherein the protective layer is positioned between the capacitor dielectric layer and the semi-conductive substrate.

10. A trench capacitor, comprising:
    a semi-conductive substrate having an STI;
    a first trench and a second trench disposed in the semi-conductive substrate, wherein the second trench is positioned below the first trench and connects to the first trench;
    a third trench and a fourth trench disposed in the semi-conductive substrate, wherein the fourth trench is positioned below the third trench and connects to the third trench, wherein the STI is disposed between the first trench and the third trench;
    two first electrodes, one of the first electrode filling the first trench and the second trench, and the other first electrode filling the third trench and the fourth trench;
    two oxide layers positioned in the semi-conductive substrate at sidewall of the first trench and at sidewall of the third trench respectively, and the two oxide layers contacting the semi-conductive substrate;
    two protective layers disposed in the first trench and the third trench respectively, wherein parts of the two protective layers directly contact sidewalls of the STI, and the two protective layers directly contacting the STI sandwich the STI;
    two second electrodes positioned inside and at sidewall of the second trench and positioned inside and at sidewall of the fourth trench respectively; and
    two capacitor dielectric layers positioned between the second electrode and the first electrode in the second trench, and positioned between the second electrode and the first electrode in the fourth trench respectively.

11. The trench capacitor of claim 10, wherein one of the protective layers disposed in the first trench is positioned between one of the capacitor dielectric layers and the semi-conductive substrate.

12. A trench capacitor, comprising:
    a semi-conductive substrate having an STI;
    a first trench and a second trench disposed in the semi-conductive substrate, wherein the second trench is positioned below the first trench and connects to the first trench;
    a third trench and a fourth trench disposed in the semi-conductive substrate, wherein the fourth trench is positioned below the third trench and connects to the third trench, wherein the STI is disposed between the first trench and the third trench;

two first electrodes, one of the first electrode filling the first trench and the second trench, and the other first electrode filling the third trench and the fourth trench;

two oxide layers positioned in the semi-conductive substrate at sidewall of the first trench, and at sidewall of the third trench respectively and the two oxide layers contacting the semi-conductive substrate;

two protective layers disposed in the first trench and the third trench respectively;

two second electrodes, one of the second electrodes positioned at sidewall of second trench and the other second electrode positioned at sidewall of the fourth trench, wherein parts of the STI are sandwiched between the second electrodes; and two capacitor dielectric layers positioned between the second electrode and the first electrode in the second trench, and positioned between the second electrode and the first electrode in the fourth trench respectively.

* * * * *